United States Patent [19]

Henley

[11] Patent Number: 5,073,754

[45] Date of Patent: Dec. 17, 1991

[54] METHOD AND APPARATUS FOR TESTING LCD PANEL ARRAY USING A MAGNETIC FIELD SENSOR

[75] Inventor: Francois J. Henley, Los Gatos, Calif.

[73] Assignee: Photon Dynamics, Inc., San Jose, Calif.

[21] Appl. No.: 557,257

[22] Filed: Jul. 24, 1990

[51] Int. Cl.$^5$ .......................... G01R 31/28; G09G 3/30

[52] U.S. Cl. .......................................... 324/529; 340/784

[58] Field of Search ................. 324/527, 529; 340/784; 350/333

[56] References Cited

U.S. PATENT DOCUMENTS

| | | | |
|---|---|---|---|
| 3,992,663 | 11/1976 | Seddick | 324/529 |
| 4,507,605 | 3/1985 | Geisel | 324/501 |
| 4,542,333 | 9/1985 | Koontz | 324/529 |
| 4,633,242 | 12/1986 | Sekiya | 340/719 |

FOREIGN PATENT DOCUMENTS

| | | | |
|---|---|---|---|
| 3111393 | 9/1982 | Fed. Rep. of Germany | 324/529 |
| 153262 | 11/1981 | Japan | 324/529 |
| 154678 | 11/1981 | Japan | 324/329 |
| 99768 | 6/1983 | Japan | 324/529 |

OTHER PUBLICATIONS

Wisnieff et al., "In-Process Testing of Thin-Film Transistor Arrays" *SID* 90 *Digest* pp. 190-193.

"Unsurpassed Technology Resources, and Commitment Make Hitachi Your Best LCD Partner".

Luo et al., "Testing and Qualifications of a-Si TFT-LC Color Cells for Military Avionics Applications" *SID* 90 *Digest* pp. 194-196.

Becker et al., "Measurement of Electro-Optic Characteristics of LCDs" *SID* 90 *Digest* pp. 163-166.

*Primary Examiner*—Kenneth A. Wieder

*Assistant Examiner*—Maura K. Regan

*Attorney, Agent, or Firm*—Townsend and Townsend

[57] ABSTRACT

An LCD panel or the like is tested by determining whether any short circuit defects are present. The panel is tested for short circuit defects by scanning gate lines and drive lines with a magnetic field pickup device while a current is applied to a shorting bar which shorts together a plurality of gate lines or a plurality of drive lines. When a short circuit defect is present, a current flows through the shorted area. As a result, a corresponding magnetic field is generated along the involved lines. For a cross-short defect, the location of the defect is identified as the intersection of the drive line and gate line which generate magnetic fields of substantially the same strength.

3 Claims, 3 Drawing Sheets

METHOD AND APPARATUS FOR TESTING LCD PANEL ARRAY USING A MAGNETIC FIELD SENSOR

BACKGROUND OF THE INVENTION

This invention relates to testing of liquid crystal display (LCD) panel arrays, and more particularly to a method and apparatus for testing LCD panel arrays in which short circuit defects are detected by scanning the panel array with a magnetic field pickup device and in which open circuit defects and defective pixels are detected by the display patterns resulting from applied test cycles.

LCD panels typically are formed with a liquid crystal material sandwiched between an active plate and a ground plate. Polarizers, colorizing filters and spacers also are included between the plates. During fabrication, many active plates are formed on a single glass plate. In each area of the glass plate which is to form an active plate, drive lines, gate lines and drive elements are formed. Typically, thin-film transistors are used for the drive elements.

Each active panel has an electro-static discharge (ESD) shorting bar at each of the four edges of the active plate. The ESD bar shorts all the drive lines or gate lines which terminate at a respective edge. For an interdigitated panel, drive lines are terminated at two opposing edges while gate lines are terminated at the other two edges. Thus, four shorting bars are included, one per panel edge.

Until scribing and final installation of the LCD panel, the ESD bars remain attached to the panel so as to avoid static charge buildup. Prolonged separation of the panel from the shorting bar or another grounding apparatus may cause the static charge to build-up and damage the active panel circuitry rendering the LCD panel defective. Accordingly, a method is needed for testing the LCD panel array with the ESD grounding bars in place.

Referring to FIG. 1, a typical active matrix LCD panel segment 10 is shown consisting of an array of pixels 12. Each pixel 12 is activated by addressing simultaneously an appropriate drive line 14 and gate line 16. A drive element 18 is associated with each pixel 12. The drive lines 14, gate lines 16, pixels 12 and pixel drive elements 18 are deposited on the clear glass "active" plate by a lithographic or similar process. Because of the high pixel densities, the close proximity of the gate lines and drive lines, and the complexity of forming the pixel drive elements, there is a significant probability of defects occurring during the manufacturing process.

Known testing methods for high density LCD panels include contact testing methodologies which require connection to and testing of each individual row/column intersection within the panel array. Advanced probing technology is necessary to establish reliable contacts among the densely populated pixel elements. Such test methods are time-consuming and prone to error. For an LCD array of 640 by 480 pixel elements, a typical test cycle requires approximately 300,000 connections and consumes about two hours. The time and expense of testing, although necessary, is a limiting factor to the commercial success of large array LCD panels. A faster and more efficient testing method is needed to reduce the testing costs, and thereby reduce the product costs of LCD panels so as to compete with CRT and other display types.

Accordingly, it is desireable to be able to test large arrays easily, without direct individual electrical connection and with connections only as needed.

SUMMARY OF THE INVENTION

According to the invention, an LCD panel or the like is tested by first determining whether any short circuit defects are present, then if none are present (or when the short circuit defects are repaired) determining whether any open circuit defects are present or any pixels are defective. According to one aspect of the invention, the panel is tested to see if any short circuit defects are present by applying current signals to each of the shorting bars. If no shorts are present, then no current flow is sensed. If any shorts are present, then current flow is sensed at one or more shorting bars.

According to another aspect of the invention, each drive line and gate line having a short circuit defect are isolated by applying a current signal to a shorting bar while scanning the panel's gate lines and drive lines with a magnetic field pickup device. When a short circuit defect is present, a current flows between lines that are shorted. As a result of the current flow, a corresponding magnetic field is generated at the involved lines. Thus, when a magnetic field is sensed, a short circuit defect is present. Because the gate lines and drive lines terminating at the periphery of the panel are spaced approximately 3 to 5 mils (75 to 376 microns) apart, a sensitive magnetic pick-up is able to isolate the line(s) involved. For a cross-short defect, the location of the defect is identified as the intersection of the drive line and gate line which each generate a magnetic field. Upon successful completion of the short circuit testing procedures (e.g., no short circuit defects), the panel undergoes open circuit and pixel testing. Upon unsuccessful completion of the short circuit testing procedures, the panel is repaired or discarded.

The invention will be better understood by reference to the following detailed description taken in conjunction with the accompanying drawings.

DESCRIPTION OF THE PREFERRED EMBODIMENT

Panel Configuration

Figure 1:
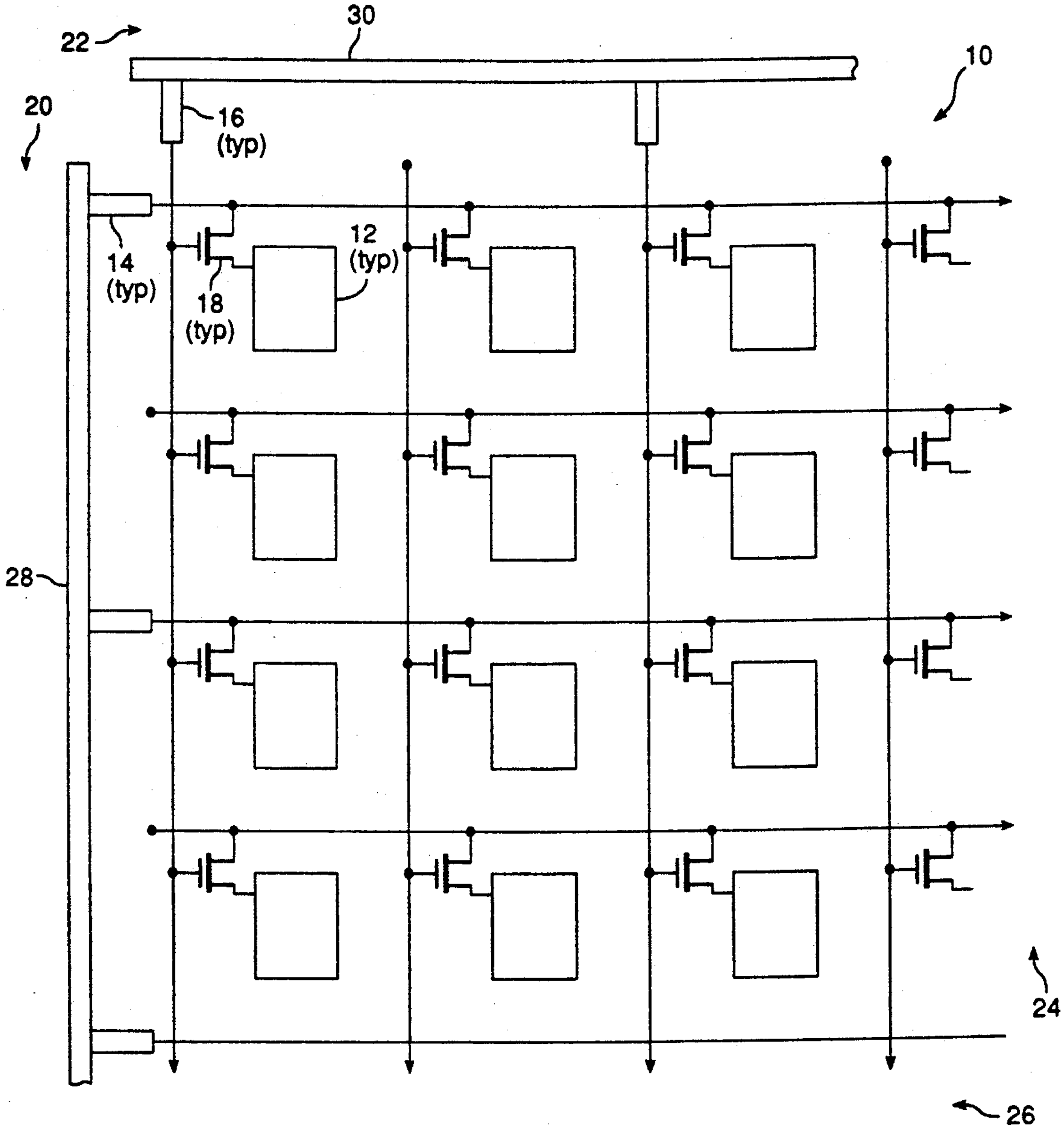
FIG. 1 is a block diagram illustrating a portion of an LCD panel array.

Referring to FIG. 1, a section of an LCD panel 10 is shown including several pixel circuit elements 12. Associated with each pixel circuit element 12 is a drive line 14 and a gate line 16, as previously described. For an interdigitated panel (shown), every other drive line is terminated along one panel boundary 20, while the other drive lines are terminated along the opposite, but parallel, boundary 24 (see FIG. 2). Similarly, every other gate line 16 is terminated along one panel boundary 22 adjacent and generally orthogonal to the drive line panel boundaries 20, 24, while the other gate lines 16 are terminated along the opposite panel boundary 26, also adjacent and generally orthogonal to the drive line panel boundaries 20, 24.

During testing of the LCD panel 10, the electrostatic discharge shorting bars are present. As shown in FIGS. 1–4, there are four shorting bars 28, 30, 32, 34 for an interdigitated panel, one at each edge of the panel 10. Bar 28 shorts the drive lines 14 terminating at edge 20. Bar 30 shorts the gate lines 16 terminating at edge 22. Bar 32 shorts the drive lines 14 terminating at edge 24. Bar 34 shorts the gate lines 16 terminating at edge 26.

Panel Defects

It has been determined that the most common defects for high density panels are cross-short circuit defects between a column gate line and a row drive line. In particular, the cross-short circuit defects are most likely to occur at the drive transistor between the gate and source or between the gate and drain. Short circuit defects between adjacent column lines or between adjacent row lines are less likely because a pixel element is located between the adjacent column lines or row lines. In addition, it has been found that an open circuit defect only occurs in approximately one of every five panels manufactured. The presence of two or more open circuit defects in a panel is unlikely. The test methodology takes advantage of these defect characteristics to provide a quick and efficient testing methodology.

Test Apparatus Configuration

Figure 2:
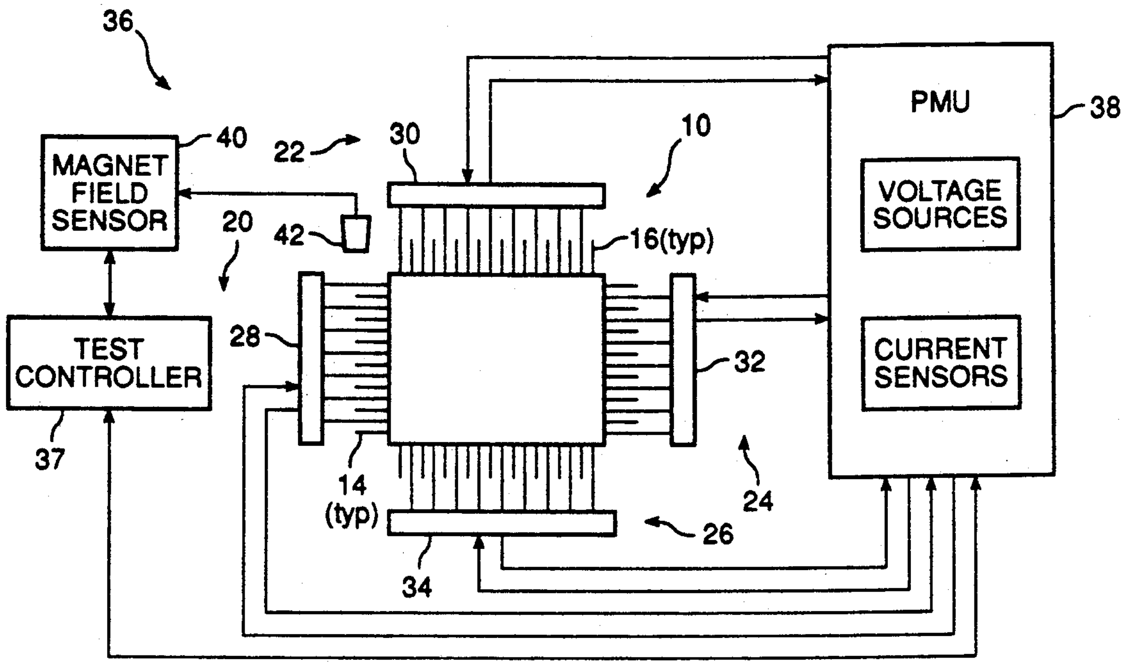
FIG. 2 is a block diagram of a test configuration for testing the LCD panel of FIG. 1 according to an embodiment of this invention.

Referring to FIG. 2, a test configuration 36 according to an embodiment of this invention is shown, including the LCD panel 10, a test controller 37, a conventional precision measurement unit (PMU) 38, and a magnetic field sensor 40 having a magnetic pick-up 42. The operation of the controller 37, PMU 38 and magnetic sensor 40 is described below as part of the short circuit testing procedure and the open-circuit/pixel testing procedure.

Short Circuit Testing Procedure

Referring to FIG. 2, the test configuration 36 for detecting short circuit defects on an LCD panel 10 is shown. To detect whether the panel 10 has any short circuit defects, a current signal is applied by the PMU 38 to each shorting bar 8, 30, 32, 34, while also monitoring the shorting bars 28, 30, 2, 34. Alternatively, a current signal may be applied to each one shorting bar in sequence while each of the other shorting bars are monitored. For example, bar 28 receives a current signal while bars 30, 32, and 34 are monitored by the PMU 38. The PMU 38 current sensors detect whether any current is flowing through the drive lines 14 and gate lines 16. If no current is detected by the PMU 38 at any of the shorting bars 28, 30, 32, 34, then the panel 10 has no short circuit defects and the panel is tested subsequently for open circuit defects and defective pixels. If current is flowing at one or more shorting bars, then a short circuit defect is present among the drive lines or gates lines terminating at such one or more shorting bars.

To isolate the involved drive lines(s) and/or gate line(s) and locate each short circuit defect once the panel has been found to have at least one short circuit defect, the test controller 37 signals the PMU 38 to apply a current signal to one of the involved shorting bars 28, 30, 32, 34. While the shorting bar is exposed to such current signal, the controller 37 signals the magnetic sensor 40 to scan the drive lines 14 and gate lines 16 at each edge 20, 22, 24, 26 of the panel 10 to which each involved shorting bar is attached. The magnetic sensor 40 includes a magnetic field pick-up device 42 which scans such lines 14, 16. The detected magnetic field strength and pick-up device 42 position are fed back to the controller 37 for locating each one of the drive lines 14 and gate lines 16 which generate a magnetic field.

Each shorting bar 28, 30, 32, 34 previously found to have current flowing is tested by applying a current signal, while the magnetic field pick-up device 42 scans the drive lines 14 and gate lines 16. For example, if shorting bars 30 and 32 were previously identified as having current flow, then while bar 30 receives a current signal, the magnetic pick-up 42 scans the drive lines 14 coupled to the shorting bar 30 and the gate lines 16 coupled to the shorting bar 32. Because the drive lines 14 and gate lines 16 are typically less than 1 micron wide and spaced 75 to 375 microns apart, a sensitive pick-up 42 may isolate each line 14, 16 which has current flowing.

Figure 3:
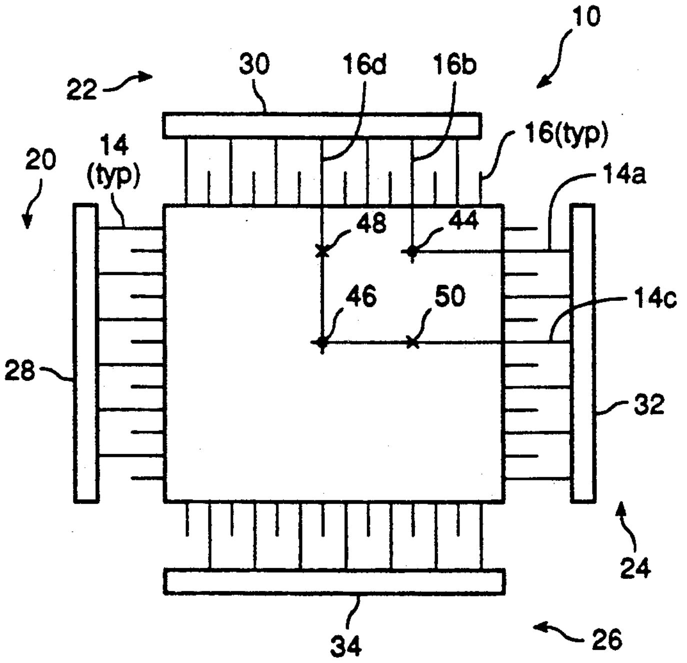
FIG. 3 is a block diagram of the LCD panel of FIG. 1 depicting cross-short defects.
Figure 4:
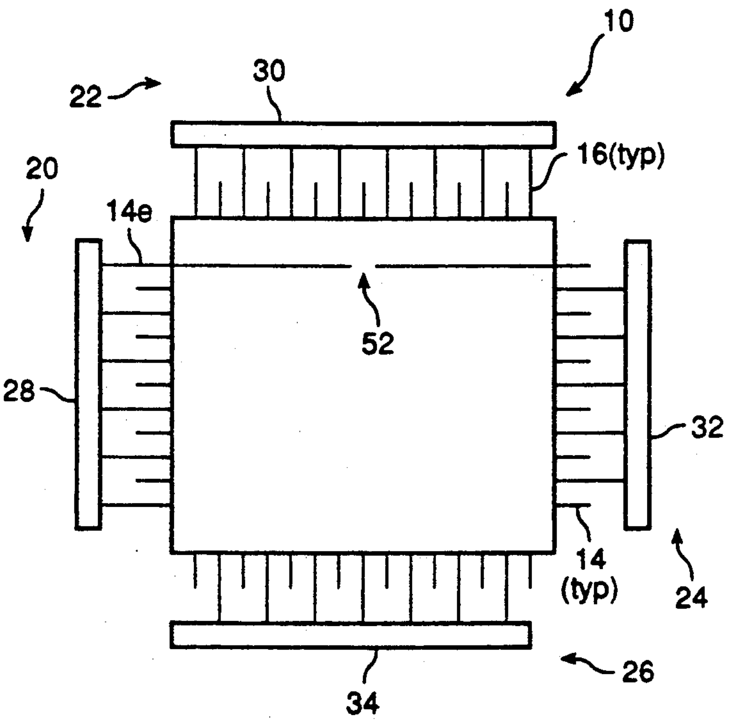

Referring to FIG. 3, a defective panel 10 is shown having actual short circuit defects at points 44 and 46. Point 44 involves a cross-short circuit defect between drive line **14*a* and gate line 16*b*. Point 46 involves a cross-short circuit defect between drive line 14*c* and gate line 16*d*. If a crossshort circuit defect were present only at point 44, then the scan with the magnetic pick-up 42 would detect only drive line 14*a* and gate line 16*b* as generating magnetic fields. Because only one short circuit defect is present in such situation, the location of the short circuit defect is readily determined to be the intersection of the identified lines 14*a* and 16*b***.

For the case where there are two short circuit defects 44, 46 as shown in FIG. 3, drive lines **14*a* and 14*c* and gate lines 16*a* and 16*c* are identified as the shorted lines. As a result, the four intersections of drive lines 14*a*, 14*c* and gate lines 16*a*, 16*c* are identified as cross-short circuit defects. Thus, the actual short circuit defects 44 and 46 are identified, while, in addition, phantom short circuit defects 48 and 50** also are identified. The phantom short circuit defects are not actual defects.

A short circuit is characterized as a path of electrical conduction between lines which are supposed to be electrically isolated. The point of the short circuit, thus, includes conductive material bridging the involved lines. Such conductive material has a resistance to current flow. The severity of the short circuit determines the resistance value, and thus, the current and magnetic field strengths. Therefore, short circuits of varying severity result in current flows and magnetic field strengths, which vary accordingly.

Where the short circuit defects 44, 48 are of different severity, the resulting currents differ. As a result, the magnetic field strengths at drive line **14*a* and gate line 16*b* differ from the magnetic field strengths generated at drive line 14*c* and gate line 16*d*. The test controller 37 compares the magnetic field strengths at each line 14*a*, 14*c*, 16*b*, 16*d* to determine which have substantially the same magnetic field strength. Those of substantially the same strength are matched as being the lines involved in at least one common cross-short circuit defect. Thus, defects 44, 46 may be isolated from the phantom shorts 48, 50 and identified as the short circuit defects. When the resulting magnetic field strengths do not significantly differ, each of the four short circuit defects 44–50** is identified as a cross-short circuit defect.

Although a preferred embodiment of the invention has been illustrated and described, various alternatives, modifications and equivalents may be used. Therefore, the foregoing description should not be taken as limiting the scope of the invention which is defined by the appended claims.

What is claimed is:

1. A method for locating cross-short circuit defects in an LCD panel having a plurality of drive lines oriented in a first direction and a plurality of gate lines oriented in a second generally orthogonal direction creating row/column intersections, each drive line terminating along a first edge of the panel being shorted together by a first shorting means, each gate line terminating along a second edge of the panel being shorted together by a second shorting means, said method comprising the steps:

applying a signal to at least one shorting means of said first shorting means and said second shorting means;

for each one line of said plurality of lines terminating at said at least one shorting means, scanning said one line with a magnetic field sensing means to detect whether a magnetic field is generated at said one line, wherein any said one line generating a magnetic field has a short circuit defect;

for each one line of said plurality of lines terminating at a shorting means other than said at least one shorting means, scanning said one line with a magnetic field sensing means to detect whether a magnetic field is generated at said one line, wherein any said one line generating a magnetic field has a short circuit defect; and comparing the magnetic field strength for each said one line, wherein, each said one line having substantially the same magnetic field strength is indicated as being involved in at least one common short circuit defect.

2. An apparatus for testing an LCD panel having a plurality of drive lines oriented in a first direction and a plurality of gate lines oriented in a second generally orthogonal direction creating row/column intersections, said apparatus comprising:

first means for shorting together each drive line terminating along a first edge of the panel;

second means for shorting together each gate line terminating along a second edge of the panel;

means for applying a signal to at least one shorting means of said first and second shorting means;

means for scanning each one line of a plurality of drive lines and a plurality of gate lines, said scanning means comprising means for sensing a magnetic field strength generated by said one line, wherein any said one line generating a magnetic field has a short circuit defect; and means for comparing the magnetic field strength for each said one line, wherein each said one line having substantially the same magnetic field strength is indicated as being involved in at least one common short circuit defect.

3. A method for locating cross-short circuit defects in an LCD panel having a plurality of drive lines oriented in a first direction and a plurality of gate lines oriented in a second generally orthogonal direction creating row/column intersections, each drive line terminating along a first edge of the panel being shorted together by a first shorting means, each gate line terminating along a second edge of the panel being shorted together by a second shorting means, said method comprising the steps:

applying a signal to at least one shorting means of said first shorting means and said second shorting means;

for each one line of said plurality of lines terminating at said at least one shorting means, scanning said one line with a magnetic field sensing means to detect whether a magnetic field is generated at said one line, wherein any said one line generating a magnetic field has a short circuit defect; and comparing the magnetic field strength for each said one line, wherein, each said one line having substantially the same magnetic field strength is indicated as being involved in at least one common short circuit defect.

* * * * *